United States Patent [19]

Tregilgas

[11] Patent Number: 4,462,959
[45] Date of Patent: Jul. 31, 1984

[54] HGCDTE BULK DOPING TECHNIQUE

[75] Inventor: John H. Tregilgas, Richardson, Tex.

[73] Assignee: Texas Instruments, Dallas, Tex.

[21] Appl. No.: 365,135

[22] Filed: Apr. 5, 1982

[51] Int. Cl.³ .............................................. H01L 3/20
[52] U.S. Cl. .................................... 420/525; 420/526;
420/903; 156/606; 156/DIG. 72
[58] Field of Search ........................ 420/525, 526, 903;
156/624, 605, DIG. 82, 606, DIG. 72; 148/33,
189

[56] References Cited

U.S. PATENT DOCUMENTS

| 3,344,071 | 9/1967 | Cronin | 252/623 R |
| 3,392,193 | 7/1968 | Haistey et al. | 252/512 |
| 3,723,190 | 3/1973 | Kruse et al. | 156/606 |
| 4,089,714 | 5/1978 | Johnson et al. | 148/33 |

FOREIGN PATENT DOCUMENTS 2284367  4/1976  France ........................ 156/DIG. 72

OTHER PUBLICATIONS

R. K. Willardson and W. P. Allred, Distribution Coefficients in Gallium Arsenide, 1966, pp. 35–40.
Semiconductors and Semimetals, vol. 18, Chapter 3, Crystal Growth of Cadmium Mercury Telluride by W. F. H. Micklethwaite, 1981..

Primary Examiner—L. Dewayne Rutledge
Assistant Examiner—S. Kastler
Attorney, Agent, or Firm—Jim Comfort; Robert Groover; Dave Carlson

[57] ABSTRACT

Controllable doping of HgCdTe in concentrations low enough to be useful for electronic devices is accomplished by dissolving the desired dopant in mercury at or below the solubility limit. The mercury is then diluted with pure mercury, to lower the dopant concentration to that which will produce the desired impurity concentration in the end product. The doped mercury is then compounded according to conventional methods, to produce reproducibly doped HgCdTe of uniform composition.

18 Claims, No Drawings

HGCDTE BULK DOPING TECHNIQUE

BACKGROUND OF THE INVENTION

The present invention relates to a method for providing doped HgCdTe "HgCdTe" is used to refer generically to the range of alloys formed by varying the proportions of mercury and cadmium between mercury telluride and cadmium telluride. Since the two end point compositions are completely intermiscible, and have almost the same lattice constant, and since mercury telluride is a semi-metal whereas cadmium telluride is a semiconductor, a semiconductor having any desired small bandgap may be formed simply by varying the proportion of mercury in a HgCdTe alloy. This property makes this chemical system extremely useful for infrared sensors. The chemical formula can be written more explicitly as $Hg_{1-x}Cd_xTe$, where x has a value between zero and one, selected to provide a desired bandgap. For the material of greatest interest, x will be in the range of 0.15 (bandgap corresponding to a wavelength at 12 microns or longer) to 0.3 (bandgap corresponding to a 5 micron wave length).

However, the HgCdTe alloy system has some rather intractable physical properties. In particular, incongruent solidification is normal. Since the melting point of cadmium telluride is much higher than that of mercury telluride, and the various alloys have intermediate melting points, any high temperature processing step may cause alloy segregation, which destroys the utility of the material for electronic devices.

Thus, if bulk HgCdTe is to be prepared, two uniformity problems must be solved simultaneously: first, a uniform (and reproducible) distribution of the dopant must be provided; second this must be accomplished within a compositionally uniform HgCdTe alloy.

Because of this double problem, normal bulk doping techniques are inapplicable. For example, zone refining is commonly used to introduce a controlled percentage of an impurity. In this technique, temperature gradients are controlled within a furnace, so that a molten zone is gradually moved from one end of a material sample to the other. The impurities are transported within the molten zone, within which they have a higher solubility. Zone leveling (i.e., a further pass of the molten zone through the material, in the direction of decreasing concentration, after the highest-concentration portion of the material has been physically removed) can normally then be used to further homogenize the impurity distribution. However, if these techniques are applied to HgCdTe, alloy non-uniformity results. That is, the resulting HgCdTe material will have different Hg/Cd ratios (and therefore bandgaps) between one end and the other, and will also vary between the center and the surface of the material.

While it is possible to provide a controlled light doping of epitaxial HgCdTe material, by ion implantation, this technique has several limitations. First, since most dopants of interest in HgCdTe have very large diffusivities, the anneal required to remove the implant damage will tend to homogenize impurity profiles throughout the device. In particular, the impurities introduced into the epitaxial layer will tend to be leached into the bulk, unless the bulk already has a comparable concentration of similar impurities. Moreover, in the present state of the art, bulk material can be prepared with better crystal quality.

A more specific desired objective is the preparation of good quality P-type HgCdTe material. Such material is particularly desirable for fabrication of infrared detectors. A further difficulty here is that any ion implant process in HgCdTe will tend to give N-type material, presumably due to formation of vacancies within the lattice.

Conventional methods for adding impurities to HgCdTe during compounding have not allowed close compositional control in the range of 10 to the 16th atoms per cc or less. Direct weighing of an elemental impurity which is then added to a compounding ampoule only provides control to about 10 to the 17th atoms per cc. However, for fabrication of electronic devices, and particularly for field-effect devices, uniform bulk doping below 10 to the 16th per cc is highly desirable, and doping below 10 to the 15th per cc is particularly desirable.

If useful electronic or optoelectronic devices are to be formed in HgCdTe, it is highly desirable to provide a reproducible method for producing lightly and uniformly doped HgCdTe.

Thus, it is an object of the present invention to provide a method for reproducibly producing uniformly and precisely doped HgCdTe.

In particular, it is highly desirable to be able to provide HgCdTe substrates having a uniform bulk dopant concentration, at levels low enough to be electronically useful.

Thus, it is an object of the present invention to provide a method for uniformly and reproducibly bulk doping HgCdTe at concentrations below 10 to the 16th per cc.

It is a further object of the present invention to provide a method for uniformly and controllably bulk doping HgCdTe at concentrations less than 10 to the 15th per cc.

The prior art of compounding gallium arsenide has used a liquid phase of one component combined with dopants. Thus, for example, 250 milligrams of an impurity such as chromium might be dissolved in 750 grams of gallium, and then arsenic vapor transported to compound gallium arsenide, see U.S. Pat. No. 3,392,193 to Haisty et al. and U.S. Pat. No. 3,344,071 to Cronin. However, the minimum residual impurity levels in bulk gallium arsenide are typically 5 times 10 to the 15th or greater, whereas in HgCdTe, they may be as low 10 to the 14th. Moreover, gallium arsenide art has increasingly concentrated on performing good quality epitaxial material so that the doping concentration of bulk material need not be controlled. Thus, the goal of low bulk doping levels, which is so important in HgCdTe art, is not addressed by the GaAs art. Moreover, gallium arsenide is typically formed in large ingots, which HgCdTe cannot be (since large HgCdTe ingots suffer segregation due to dendritic solidification), so that direct weighing of bulk dopants is practical in the GaAs art, unlike the HgCdTe art. Thus, the gallium arsenide art was not directed toward precise control of a low impurity concentration, and also the gallium arsenide art is not faced with the incessant difficulties of compositional non-uniformity which plague HgCdTe materials work.

SUMMARY OF THE INVENTION

In the present invention, a known concentration of dopant in mercury is introduced prior to compounding with cadium and tellurium. Thus, a known concentration of dopant is reproducibly introduced into HgCdTe, but no compositional non-uniformity is induced in the HgCdTe alloy.

According to the present invention, there is provided:

A method for providing bulk HgCdTe having a selected concentration of a selected dopant, comprising the steps of:

providing pure liquid mercury;

dissolving the desired dopant in mercury to achieve a final concentration of said dopant in the mercury, such that the final concentration of the dopant in the mercury corresponds to the desired concentration of the dopant in HgCdTe; and compounding the mercury including the final concentration of the dopant, with cadmium and tellurium, whereby HgCdTe having the desired concentration of the dopant uniformly distributed throughout is formed.

DESCRIPTION OF THE PREFERRED EMBODIMENTS

The present invention permits reliable formation of lightly doped HgCdTe. It has not heretofore been possible to produce electronically useful P-type material. P-type candidate dopants of particular interest in HgCdTe include phosphorus, arsenic, antimony, bismuth, copper, gold and silver. The present invention provides a method for incorporating each of these as a uniform dopant in HgCdTe. While the state of the art in HgCdTe electronic devices remains extremely primitive, so that it is not clear which dopants will ultimately be the dopants of choice, the present invention provides a method for incorporation of any dopant which has a reasonable solubility in mercury. For convenience, the present invention will be described primarily with reference to copper, silver, or gold dopants.

Two alternative methods are provided for introducing the dopant into the liquid mercury. In the first embodiment, the dopant is simply dissolved in pure mercury in bulk. This technique may be applied with any dopant which has a sufficient solubility in mercury. For example, up to 27 grams of copper will dissolve in one liter of mercury at 23° C. This means that an electronically useful concentration will dissolve quite rapidly. Due to the liquid state of the mercury, the dopant concentration remains extremely homogenous.

The second alternative method of introducing impurities is applicable only to impurities having a high vapor pressure, such as phosphorus or antimony. These impurities may be evaporated onto the surface of a mercury pool. By super-saturating the mercury, so that the excess dopant precipitates (i.e. floats to the surface) at room temperature, the concentration of dopant in mercury may be precisely known, i.e. equal to the maximum solubility of room temperature. An advantage of this technique is that a further distillation step occurs during evaporation of the dopant, since undesired impurities in the dopant material will be discriminated against if they have lower vapor pressure.

By this means, a volume of mercury is provided with a quite accurately known dopant concentration. The doped mercury is then diluted with pure mercury as needed, to achieve mercury which has been doped to the desired dopant concentration.

Compounding of the mercury with Cd and Te, to produce HgCdTe, then proceeds in largely conventional fashion. However, when using dopants which are easily oxidized, such as phosphorus, the time during which the doped mercury is exposed to the atmosphere must be strictly limited.

The method of the present invention is alternatively applicable to transport not only P-type dopants, such as phosphorus, arsenic, antimony, bismuth, copper, gold or silver, but also to transport N-type dopants such as indium or gallium. However, this is not a frequent requirement in the present state of the art, since it is normally quite difficult to avoid the presence of N-type impurities in HgCdTe.

Thus, the method of the present invention permits:
1. Reproducible controlled fabrication of HgCdTe material having dopant levels of 10 to the 15th or less;
2. Reproducible fabrication of light-doped P-type HgCdTe;
3. Bulk dopant introduction without alloy inhomogeneity; and
4. Precise bulk doping of small (e.g., 20 grams) HgCdTe ingots.

What I claim is:

1. A method for providing bulk HgCdTe having a desired concentration of a selected dopant, comprising the steps of:

providing pure liquid mercury;

dissolving said desired dopant in mercury to achieve a concentration of said dopant in said mercury, said final concentration of said dopant in said mercury corresponding to said desired concentration of said dopant in HgCdTe; and compounding said mercury including said final concentration of said dopant, with cadmium and tellurium, whereby HgCdTe having said desired concentration of said dopant uniformly distributed throughout is formed.

2. A method for providing bulk HgCdTe having a desired concentration of a selected dopant, comprising the steps of:

providing pure liquid mercury;

dissolving said desired dopant in mercury to achieve a concentration of said dopant in said mercury, said final concentration of said dopant in said mercury corresponding to said desired concentration of said dopant in HgCdTe; and compounding said mercury including said final concentration of said dopant, with cadmium and tellurium, whereby HgCdTe having said desired concentration of said dopant is formed; and wherein said dopant is selected from the group consisting of phosphorus, arsenic, antimony, and bismuth.

3. A method for providing bulk HgCdTe having a desired concentration of a selected dopant, comprising the steps of:

providing pure liquid mercury;

dissolving said desired dopant in mercury to achieve a concentration of said dopant in said mercury, said final concentration of said dopant in said mercury corresponding to said desired concentration of said dopant in HgCdTe; and compounding said mercury including said final concentration of said dopant, with cadmium and tellurium, whereby HgCdTe having said desired concentration of said dopant is formed; and wherein said first concentration of said dopant in mercury comprises a saturated concentration.

4. The process of claim 1, wherein said dopant is selected from the group consisting of copper, gold, and silver.

5. The process of claim 1, wherein said dopant is selected from the group consisting of indium and gallium.

6. A method for providing bulk HgCdTe having a desired concentration of a selected dopant, comprising the steps of:
providing pure liquid mercury;
dissolving said desired dopant in mercury to achieve a concentration of said dopant in said mercury, said final concentration of said dopant in said mercury corresponding to said desired concentration of said dopant in HgCdTe; and
compounding said mercury including said final concentration of said dopant, with cadmium and tellurium, whereby HgCdTe having said desired concentration of said dopant is formed; and
wherein said desired concentration of said dopant in HgCdTe is less than $10^{16}$ per cc.

7. The process of claim 6, wherein said desired concentration is less than $10^{15}$ per cubic centimeter.

8. A method for providing bulk HgCdTe having a desired concentration of a selected dopant, comprising the steps of:
providing pure liquid mercury;
dissolving said desired dopant in mercury to achieve a concentration of said dopant in said mercury, said final concentration of said dopant in said mercury corresponding to said desired concentration of said dopant in HgCdTe; and
compounding said mercury including said final concentration of said dopant, with cadmium and tellurium, whereby HgCdTe having said desired concentration of said dopant is formed; and
wherein said process of dissolving said dopant in mercury comprises evaporating said dopant in proximity to said mercury, whereby said dopant is deposited into the surface of said mercury.

9. A method for providing bulk HgCdTe having a desired concentration of a selected dopant, comprising the steps of:
providing pure liquid mercury;
dissolving said desired dopant in mercury to achieve a concentration of said dopant in said mercury, said final concentration of said dopant in said mercury corresponding to said desired concentration of said dopant in HgCdTe; and
compounding said mercury including said final concentration of said dopant, with cadmium and tellurium, whereby HgCdTe having said desired concentration of said dopant is formed; and
wherein said process of dissolving said dopant in mercury includes:
evaporating said dopant in proximity to said mercury, where said mercury is at an elevated temperature, whereby said dopant is deposited into the surface of said mercury;
cooling said mercury to room temperature; and
decanting excess precipitated dopant from said mercury.

10. The process of claim 9, wherein said dopant is selected from the group consisting of phosphorus, arsenic, antimony, and bismuth.

11. The product formed by the process of claim 1, 2, 3, 4, 5, 6, 7, 8, 9, or 10.

12. A bulk composition of matter consisting essentially of:
$Hg_xCd_{1-x}Te$ wherein x has a value between 0.1 and 1; and
a P-type dopant uniformly disposed in said $Hg_xCd_{1-x}Te$;
wherein x has a constant local value throughout said composition;
and wherein the concentration of said P-type dopant is less than 10 to the 16th per cc.

13. A method for providing bulk HgCdTe having a desired concentration of selected dopant uniformly distributed throughout comprising the steps of:
providing pure liquid mercury;
dissolving said desired dopant in mercury to achieve a first concentration of said desired dopant, said first concentration being higher than final concentration;
diluting said mercury with additional pure mercury, to achieve said desired final concentration of said dopant in said mercury; and
compounding said mercury including said final concentration of said dopant with cadmium and tellurium, whereby HgCdTe having said desired concentration of said dopant uniformly distributed throughout is formed.

14. The method according to claim 13 wherein said dopant is selected from the group consisting of phosphorus, arsenic, antimony and bismuth.

15. The process according to claim 13 wherein said first concentration of said dopant in mercury comprises a saturated concentration.

16. The method according to claim 13 wherein said dopant is selected from the group consisting of copper, gold and silver.

17. The method according to claim 13 wherein said dopant is selected from the group consisting of indium and gallium.

18. The method according to claim 13 wherein said desired concentration of said dopant in HgCdTe is less than $10^{15}$ per cubic centimeter.

* * * * *